United States Patent [19]

Elmasry et al.

[11] Patent Number: 6,028,454
[45] Date of Patent: Feb. 22, 2000

[54] DYNAMIC CURRENT MODE LOGIC FAMILY

[75] Inventors: Mohamed Elmasry; Mohamed Allam, both of Waterloo, Canada

[73] Assignee: The University of Waterloo, Waterloo, Canada

[21] Appl. No.: 09/096,947

[22] Filed: Jun. 12, 1998

Related U.S. Application Data

[63] Continuation of application No. 09/059,666, Apr. 13, 1998, abandoned.

[30] Foreign Application Priority Data

Apr. 11, 1997 [GB] United Kingdom .................. 9707349

[51] Int. Cl.[7] .............................................. H03K 19/0948
[52] U.S. Cl. .............................. 326/115; 326/95; 326/112
[58] Field of Search ................................. 326/93, 95, 98, 326/112, 115, 119, 121

[56] References Cited

U.S. PATENT DOCUMENTS

| | | |
|---|---|---|
| 4,367,420 | 1/1983 | Foss et al. . |
| 4,570,084 | 2/1986 | Griffin et al. .............................. 326/95 |
| 5,216,295 | 6/1993 | Hoang ..................................... 326/115 |
| 5,332,936 | 7/1994 | Nakao ..................................... 326/115 |
| 5,384,493 | 1/1995 | Kuruki ..................................... 326/95 |

OTHER PUBLICATIONS

Swee Yew Choe, et al., Half–Rail Differential Logic, *Digest of Technical Papers, 1997 International Solid Circuits Conference (ISSC97)*, Session 25, Processors and Logic, Paper SP 25.6, Feb. 8, 1997, pp. 420–421.

Bai–Sun Kong, et al., Charge Recycling Differential Logic (CRDL) for Low Power Application, *IEEE Journal of Solid–State Circuits*, vol. 31, No. 9, Sep. 1996, pp. 1267–1276.

Pius Ng, et al., Performance of CMOS Differential Circuits, *IEEE Journal of Solid–State Circuits*, vol. 31, No. 6, Jun. 1996, pp. 841–846.

Akilesh Parameswar, et al., A Swing Restored Pass–Transistor Logic–Based Multiply and Accumulate Circuit for Multimedia Applications, *IEEE Journal of Solid–State Circuits*, vol. 31, No. 6, Jun. 1996, pp. 804–809.

Masayuki Mizuno, et al., A GHz MOS Adaptive Pipeline Technique Using MOS Current–Mode Logic, *IEEE Journal of Solid–State Circuits*, vol. 31, No. 6, Jun. 1996, pp. 784–791.

Abdellatif Bellaouar, et al., CMOS Logic Styles, *Low–Power Digital VLSI Design*, Kluwer Academic Publishers, 1995, pp. 176–203.

Masakazu Yamashina, et al., An MOS Current Mode Logic (MCML) Circuit for Low–Power GHz Processors, *NEC Res. & Develop.*, vol. 36, No. 1, Jan. 1995, pp. 54–63.

Anatha p. Chandrakasan, et al., Low–Power CMOS Digital Design, IEEE Journal of Solid–State Circuits, vol. 27, No. 4, Apr. 1992, pp. 473–483.

*Primary Examiner*—Michael Tokar
*Assistant Examiner*—Don Phu Le
*Attorney, Agent, or Firm*—Knobbe, Martens, Olson & Bear, LLP

[57] ABSTRACT

A dynamic current mode circuit for low-voltage and high performance VLSI applications, comprising a MOS current mode logic block and dynamic circuitry for precharging the outputs of the MOS current mode logic block, cross-coupled latches for enhancing performance of the MOS current mode logic block during an evaluation phase thereof, and a dynamic current source for enhanced speed and low power consumption.

9 Claims, 12 Drawing Sheets

DyCML Gate Architecture

MOS Current Mode Logic Gate(MCML)

DyCML Gate Architecture

Cascaded Operation of DyCML Gates

Buffering Circuit

Piplined DyCML Inverter

DyCML Clock Generation

Divide By 2 DyCML Circuit

Voltages at Different Nodes in The DyCML Inverter

Voltages at Different Nodes in The DyCML Inverter

Voltages at Different Nodes in The DyCML Inverter

Maximum Operating Frequency vs. Supply Voltage

Power, Delay and Power-Delay Product Of DyCML vs. Supply

Power and Power-Delay Product vs. Operating Frequency ($V_{DD}$ =3.3volt)

Generate Gate of a 4Bit Carry Look Ahead Adder

1 Level, 16 Bit CLA Adder

DYNAMIC CURRENT MODE LOGIC FAMILY

This application is a continuation of U.S. patent application Ser. No. 09/059,666 filed on Apr. 13, 1998, now abandoned.

FIELD OF THE INVENTION

This invention relates in general to VLSI circuits, and more particularly to a novel logic family (referred to herein as DyCML) for low-voltage, low-power and high-performance VLSI design applications. The logic family of the present invention combines the features of both MOS Current Mode Logic (MCML) and of dynamic circuitry.

BACKGROUND OF THE INVENTION

For the last two decades, the main criterion for VLSI circuit design has been high performance. Small area and low-power dissipation have been secondary considerations. Recently, the increasing demand for battery powered systems like mobile computers, personal communications services (PCS) and wireless communications systems has shuffled this order of importance, making low-power design the most important criterion. This is a result of the fact that battery operating time of any portable system is a very important parameter. Unfortunately, improvements in battery design have not been rapid enough to accommodate the increasing power demands of high performance systems.

Another reason for the increased importance of low power in VLSI design is the continuous reduction in transistor sizes which allow the integration of larger numbers of transistors in smaller areas. Increasing the number of transistors per unit area increases heat dissipation and chip temperature which in turn reduces the reliability of semiconductor chips. Since the ability to sink heat per unit area is limited and very expensive to increase in terms of size and cost, this increasing temperature establishes an upper bound on the maximum number of transistors per unit area.

Many techniques have been developed for low power design such as described in Bellaouar and M. I. Elmasry, "Low-Power Digital VLSI Design", Keluwer Academic Publishers, 1995, and P. Chandrkasan, S. Sheng and R. W. Brodersen, "Low-Power CMOS Digital Design". Most of these techniques sacrifice performance to reduce power consumption. Generally, design for low power conflicts with design for high performance because the latter normally requires higher supply voltages, current sources and larger transistors.

According to the present invention, a Dynamic Current Mode Logic (DyCML) circuit is provided which achieves high-performance at low-voltage and low-power consumption. The DyCML logic circuitry of the present invention enjoys certain features of MCML circuits, such as high performance and noise immunity, without sacrificing static power and without requiring a large area for load resistors.

BRIEF DESCRIPTION OF THE DRAWINGS

A detailed description of the prior art and of the present invention is provided herein, with reference to the drawings, in which.

DETAILED DESCRIPTION OF THE PRIOR ART AND OF THE PREFERRED EMBODIMENT

Figure 1:
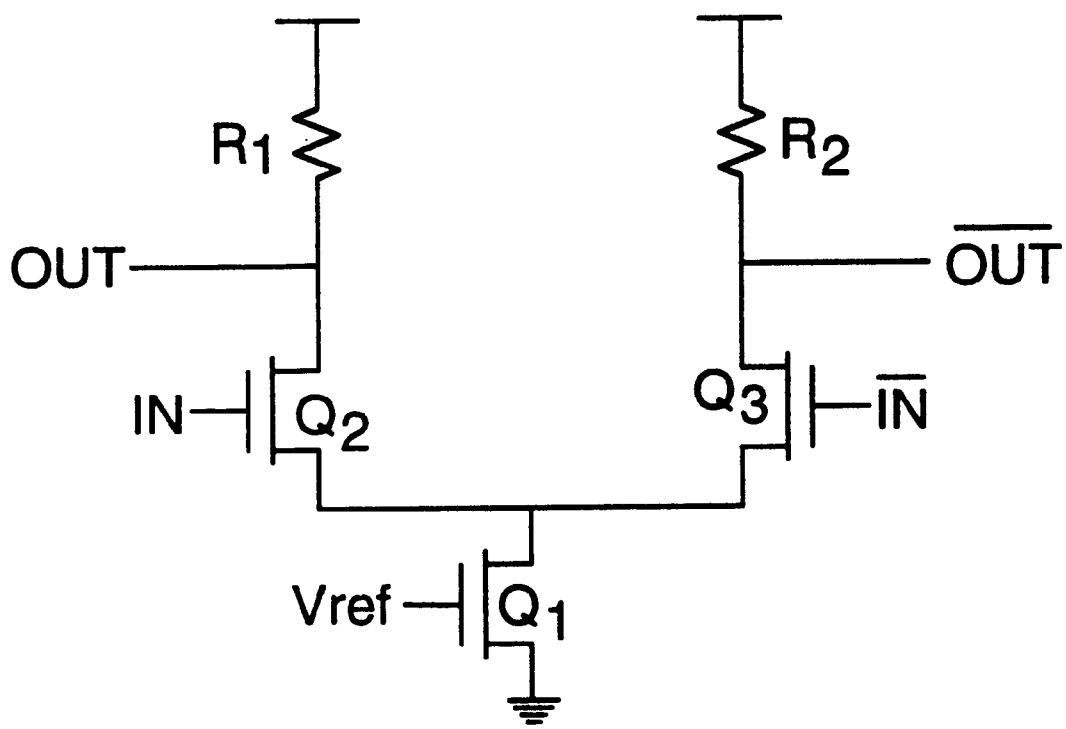
FIG. 1 is a schematic diagram of an MCML inverter according to the prior art.

As discussed in both M. Mizuno, M. Yamashina, K. Furtuta, H. Igura, H. Abiko, K. Okabe, A. Ono and H Yamada, "A Ghz MOS Adaptive Pipeline Technique Using MOS Current-Mode Logic", IEEE Journal of Circuits, vol. 31, NO. 6, June 1996, pp 784–791, and M. Yamashina and H. Yamada, "MOS Current Mode Logic (MCUL) Circuit for Low-Power GHz Processors", NEC Research & Development, v 36 n1, January 1995, Nippon Electric Co Tokyo Japan, pp 54–63, the MOS Current Mode Logic family (MCML) is one of the most popular high performance logic families. FIG. 1 shows the architecture of an MCML gate which achieves high performance at low supply voltages leading to lower dynamic power dissipation. MCML is also noise immune because of its differential nature. The delay of an MCML gate can be easily controlled by changing the driving current source value, (i.e., to achieve low current (thus low power), the delay must be increased).

The main drawback of MCML circuits is high static power consumption due to the use of a constant current source. Therefore, MCML circuits are preferably used in high frequency applications in order to reduce the overhead of static power. MCML circuits also require special technologies to implement the large load resistors $R_1$ and $R_2$.

Figure 2:
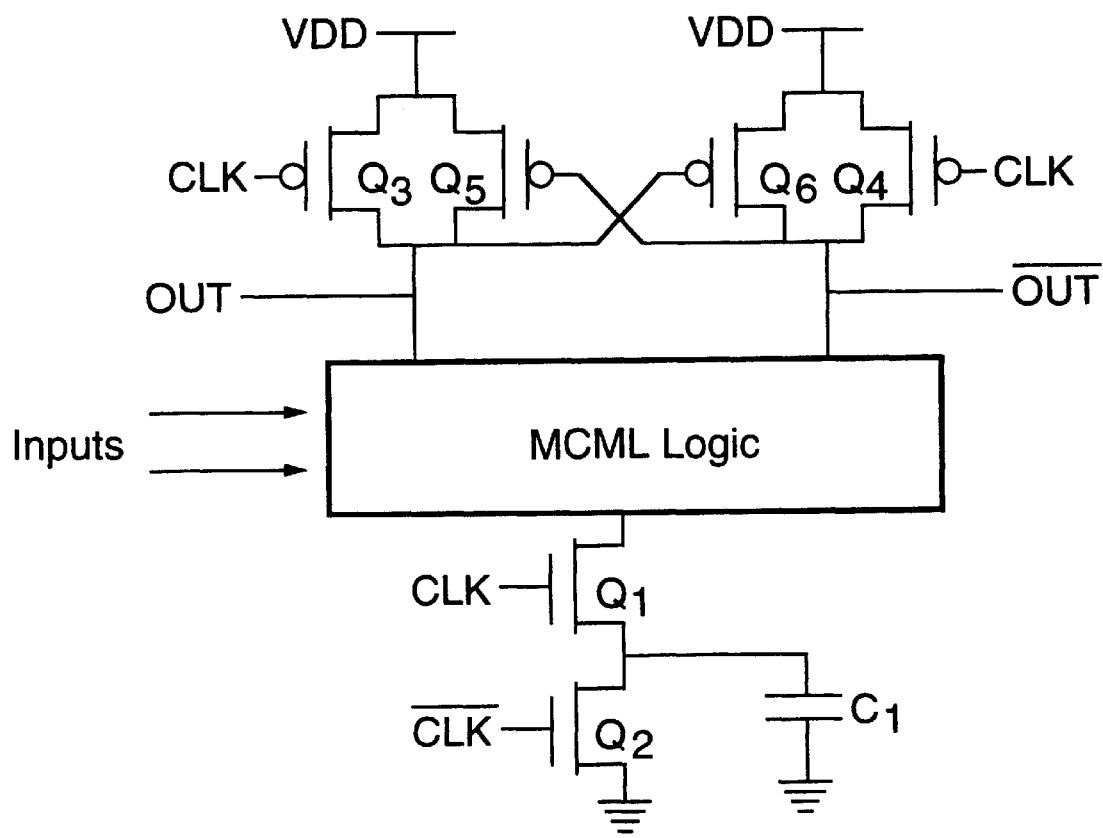
FIG. 2 is a schematic diagram of a DyCML inverter according to the present invention.

FIG. 2 shows the architecture of a DyCML gate according to the present invention. The DyCML gate comprises three parts: an MCML block for logic function evaluation, precharge transistors ($Q_3$, $Q_4$, $Q_2$), an evaluation transistor ($Q_1$) with dynamic current source ($C_1$) and an accelerating latch ($Q_5$, $Q_6$).

The operation is as follows: during the low phase of the clock (CLK), the precharge transistors $Q_3$, $Q_4$ turn ON to charge the output nodes to VDD while transistor $Q_2$ turns ON to discharge capacitor C1 to GND. At the same time, transistor $Q_1$ is OFF, eliminating the DC path from VDD to GND.

During the high clock phase, the precharge transistors $Q_2$, $Q_3$, $Q_4$, turn off while transistor $Q_1$ switches ON creating a current path from the two precharged output nodes (OUT, $\overline{\text{OUT}}$) to the capacitor $C_1$ which acts as a virtual ground. These two paths have different impedances depending on the logic function within the MCML logic block. Therefore, one of the output nodes drops faster than the other node. The cross connected transistors $Q_5$, $Q_6$, help to speed up the evaluation and eliminate the charge sharing problem which is characteristic of prior art dynamic circuits. During the evaluation phase of operation, when one of the output node voltages drops to less than VDD$-|V_{TP}|$, the transistor whose gate is connected to this node switches ON thereby charging the other output node to VDD again. The capacitor $C_1$ is used as a virtual ground to limit the swing of the outputs and also to cancel the DC path from VDD to GND due to the cross coupled transistors. The value of the capacitor $C_1$ is determined based on the value of the load capacitance (fan out) and the required voltage swing, as discussed in greater detail below.

Figure 3:
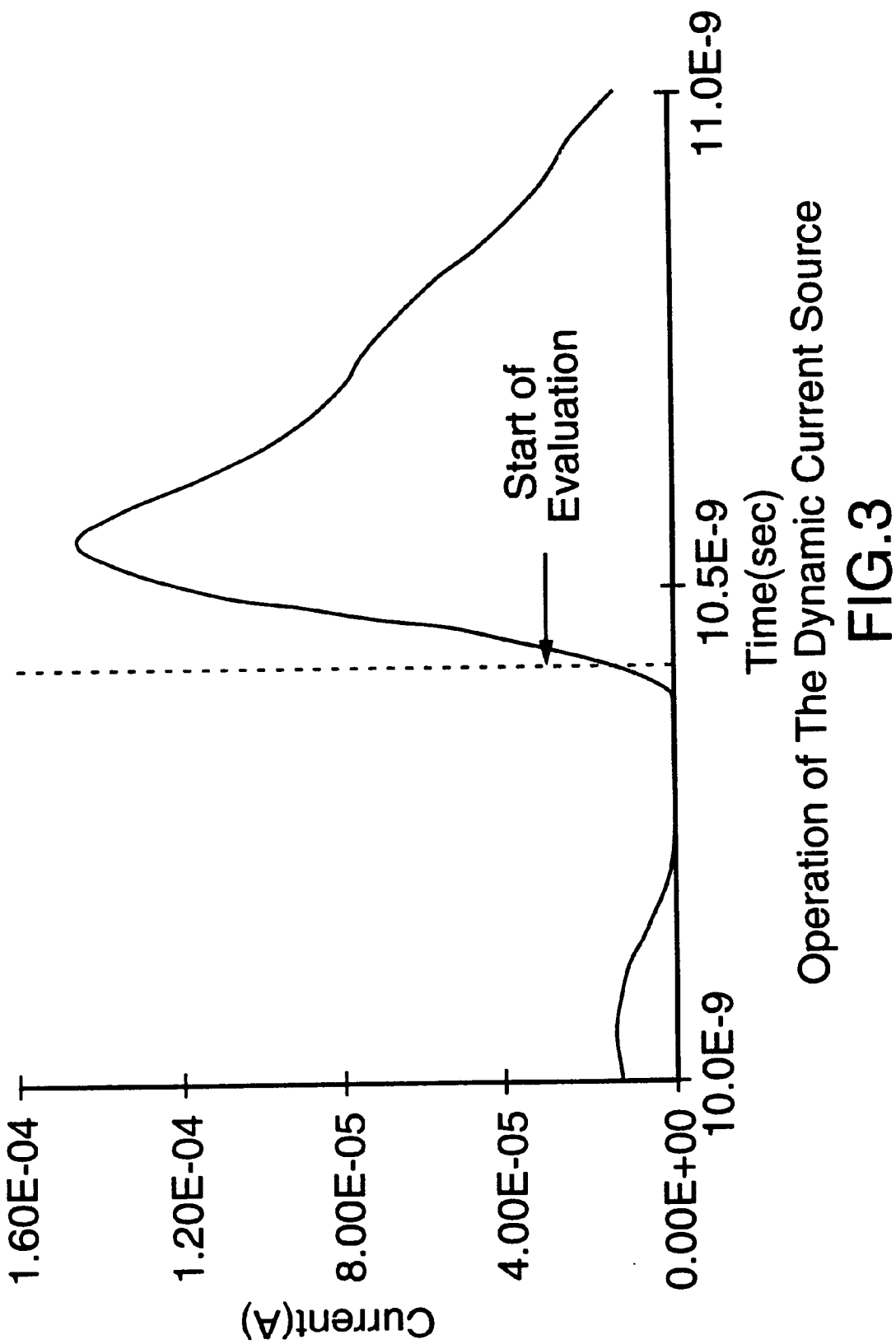
FIG. 3 shows current passing through an evaluation transistor $Q_1$ shown in FIG. 2.

Transistor $Q_1$, and capacitor $C_1$, comprise a dynamic current source which dramatically affects the circuit performance. At the start of the evaluation phase, transistor $Q_1$ acts as a current source with its gate biased by VDD, driving a large current from the MCML block. As the current charges the capacitor $C_1$, the capacitor voltage starts to rise thereby reducing the amount of current passing through transistor $Q_1$ until transistor $Q_1$ shuts OFF when $V_{DS}$ becomes zero, as shown in FIG. 3. This large current speeds up evaluation leading to a smaller delay and more stable operation than prior art MCML logic circuits.

Unlike most of the dynamic logic families, DyCML can function properly over a large range of frequencies with only a small power dissipation. This is a result of the reduced swing and the latch $Q_5$, $Q_6$ which eliminates the charge sharing problem.

The DyCML gate of FIG. 2 does not have any static power dissipation. The power dissipation is only dynamic and is data independent because one of the output nodes (OUT, $\overline{\text{OUT}}$) must be low and the other node must be high whatever the logic function is. Since the gate operation depends on a two phase clock, large clock skew and slow clock transients increase the short circuit current. Increasing the width of $Q_2$ may help avoid the effect of this short circuit current on the operation of the gate. On the other hand, the amount of short circuit current can be decreased by reducing the width of transistor $Q_1$. More general solutions to this short circuit current can be achieved using a special clock generation circuitry as described in greater detail below.

The DyCML gate according to the present invention is capable of working at low supply voltages. The lowest supply voltage is $V_{TN}+|V_{TP}|$. This value guarantees that during the evaluation process, the latch (Q5, Q6) will switch ON to avoid the problems of charge sharing and hysterises.

As discussed above, the value of $C_1$ is a function of the required output swing and the load capacitance. Since the transistor $Q_1$ passes current from the MCML block to the capacitor until the voltage across $Q_1$, approaches zero, an approximate value for the charge absorbed by the capacitor is $$Q_C = V_{swing} * C_1 \tag{1}$$

where $V_{swing}$ is the output voltage swing.

To obtain output swing $V_{swing}$, an amount of charge has to pass from one of the output nodes (OUT, $\overline{\text{OUT}}$) to $C_1$ through the MCML block. This charge is calculated as follows $$Q_0 = V_{swing} * C_L \tag{2}$$

where $C_L$ is the load capacitance per output node (including the parasitic capacitance of the MCML block, the gate capacitance of transistors $Q_5$, $Q_6$ and the parasitic capacitances of the precharge transistors $Q_3$, $Q_4$).

It will be understood to a person skilled in the art that another amount of charge flows from the second output node to $C_1$. This amount is much smaller than $Q_0$ and can be estimated to be 20% of $Q_0$. So, the total charge passed to $C_1$ is $$Q_0 = V_{swing} * C_L * 1.2 \tag{3}$$

Equating (1) and (3)

$$C_1 = C_L * 1.2 \tag{4}$$

& $C_L$=FanOut*$(C_g+C_{gd}+C_{gs})_{Load}+(C_g)_{precharge}+(C_{parasitic})_{MCML}/2+(C_{parasitic})_{precharge}$ (5)

The value of $C_L$ has to be calculated only once, then equation (5) can be used later to calculate $C_L$ for different fan-out values. Hence, $C_1$ can be calculated using equation (4).

Figure 4:
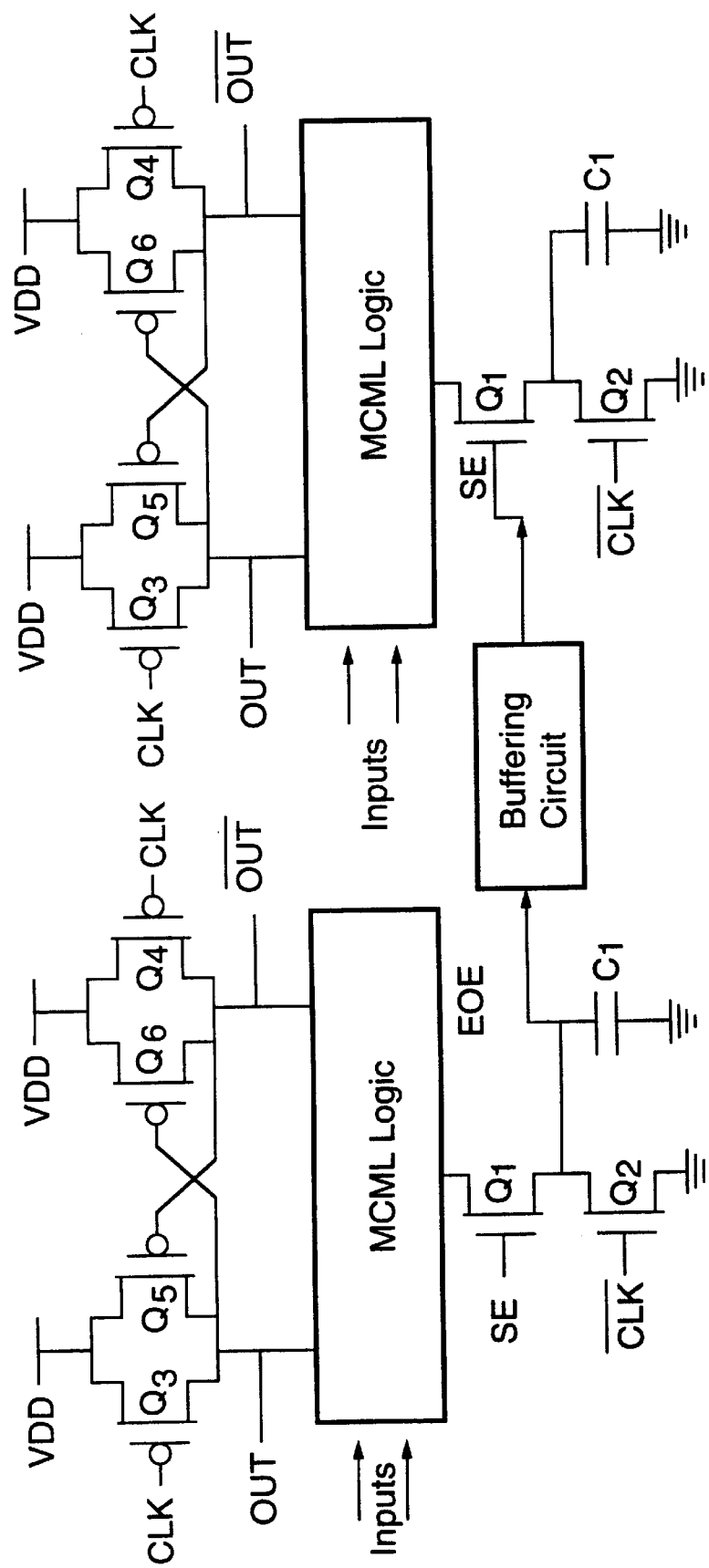
FIG. 4 shows a cascaded configuration of DyCML gates in accordance with a further embodiment of the invention.
Figure 5:
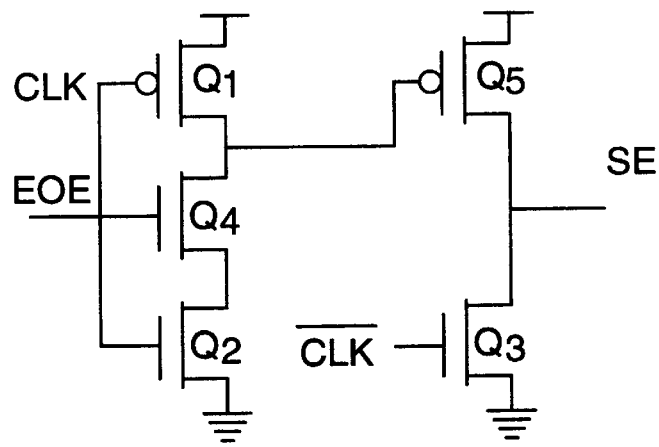
FIG. 5 is a schematic diagram of a buffering circuit used in the cascaded configuration of FIG. 4.

The DyCML family of circuits according to the present invention can be cascaded in many different ways. FIG. 4 shows a self-timed configuration for cascading DyCML gates. During the precharge period, the voltage at node EOE (End of Evaluation) is zero. When the evaluation starts, current flows from the previously charged output nodes to charge the capacitor $C_1$. A special buffering circuit then generates an SE (Start Evaluation) signal for the adjacent DyCML gate. FIG. 5 is a schematic diagram for the buffering circuit of FIG. 4. For gates with many inputs, the SE signal is obtained form the slowest input gate in order to avoid racing.

According to an alternative cascaded configuration, a clock delay architecture can be utilized to add delay to the evaluation signals at each gate before feeding the signal to the adjacent gate. Such a delay circuit would be required to be implemented for each logic level but not for each gate. One disadvantage of the proposed alternative embodiment is that the delayed signal must be adjusted to the slowest logic gate, thereby reducing the maximum speed of operation of the circuit.

The DyCML family of circuits according to the present invention can also be used in pipelined configuration, through the use of an NMOS transistor (not shown) connected to each of the output nodes, the NMOS tranistors being activated during the high phase of the clock (evaluation phase).

Figure 6:
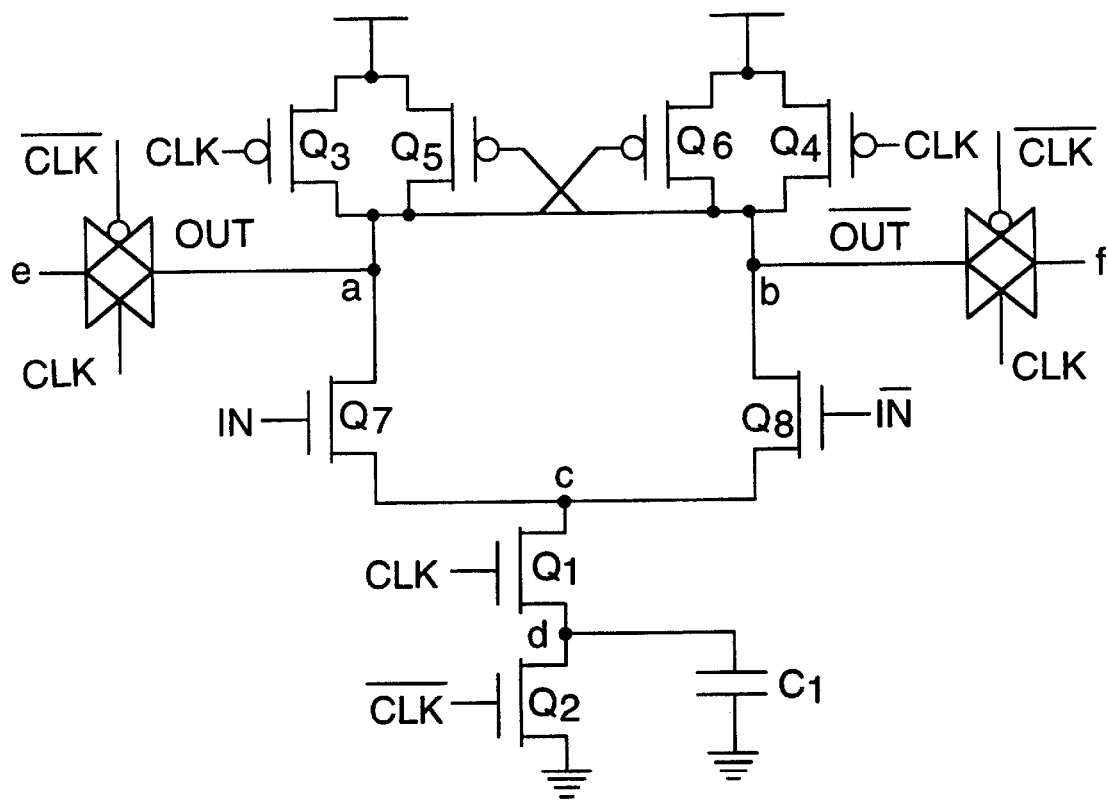
FIG. 6 shows a pipelined DyCML inverter according to a further embodiment of the present invention.

The pipelined configuration using NMOS transistors suffers from a significant disadvantage however in that the outputs of the gates may not exceed VDD-$V_{TN}$ because of the NMOS pass transistors which are used as switches. This limitation slows down the operation of the gate and increases the minimum supply voltage of the DyCML gate. To avoid this degradation, transmission gates can be used instead of the pass transistors to reduce the voltage drop across the NMOS transistors, as shown in FIG. 6.

The added transmission gates increase the load capacitance and also reduce the evaluation current. This increases the delay of the gate by a factor of 15–20%, but the total throughput of the system is higher.

Table 1 shows the basic differences between DyCML family and some other prior art dynamic differential logic families.

TABLE 1

Comparison between differential logic families

| Logic Family | DDL | DNORA | DDCVSL | HRDL | DDSL | APL | DyCML |
|---|---|---|---|---|---|---|---|
| # Transistors (inverter) | 6 | 13 | 7 | 10 | 7 | 8 | 8 |
| # Clock phases | 1 | 1 | 1 | 2 | 1 | 4 | 2 |
| Logic swing | VDD-VT | VDD | VDD | VDD | VDD | Variant | Variant |
| Technology | NMOS | CMOS | CMOS | CMOS | CMOS | CMOS | CMOS |
| Power (swing) control | NO | NO | NO | NO | NO | Difficult | YES |
| Minimum operating frequency | YES | NO | NO | YES | YES | NO | NO |
| Logic type | NCLT | DCVS | DCVS | NCLT | DCVS | MCML | MCML |
| Logic power source | Clock | VDD | VDD | VDD | VDD | VDD | VDD |
| Reference voltage | NO | NO | NO | NO | YES | YES | NO |
| Swing restorage circuit required | YES | NO | NO | NO | NO | NO | NO |
| Charge sharing exists | YES | NO | NO | YES | YES | NO | NO |
| Sensitive to clock skew | NO | NO | NO | YES | NO | YES | NO |
| Integration | YES | YES | YES | YES | YES | YES | YES |

Figure 7:
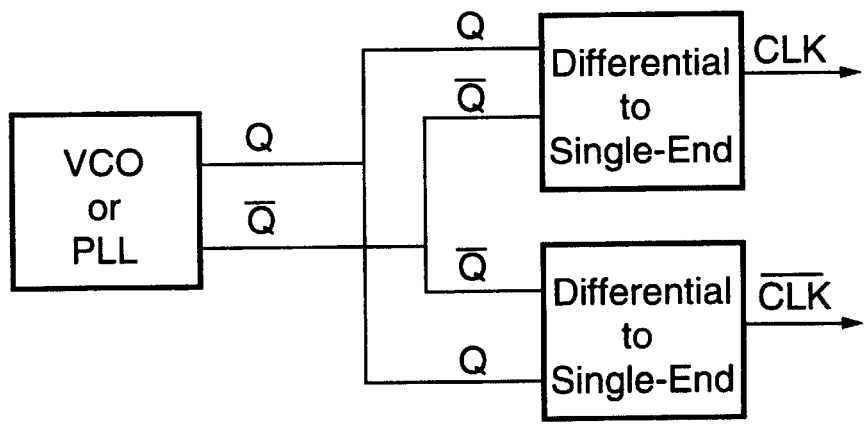
FIG. 7 is a block diagram of a clock generator with reduced clock skew for use with the DyCML circuits according to the present invention.

As indicated above, clock generation has a major effect on the dynamic power dissipation of the DyCML family of circuits according to the present invention. A single ended clock generator can be designed to generate the clock signal, CLK, and an inverter may be used to generate $\overline{CLK}$. Unfortunately, this scheme increases the clock skew and hence the power dissipation. Another approach is to use a differential clock generator followed by a single ended termination to generate CLK and $\overline{CLK}$, as shown in FIG. 7. The clock skew in this case is small and can be neglected. It is common in this embodiment to use PLL's to synchronize the clock signal around the chip.

In general, in order to reduce the short circuit current, the clock signal must be as sharp as possible. Unfortunately, using such a clock signal increases the feed through currents at the precharge ($Q_3$, $Q_4$, $Q_2$) and evaluation transistors ($Q_1$). This kind of power dissipation is a function of the technology used, and cannot easily be controlled by circuit techniques. Therefore, reducing the short circuit power consumption requires higher clock power.

This can be overcome by using reduced swing clock signals instead of full swing clock signals, particularly specially at the non critical precharge transistors ($Q_2$, $Q_3$, $Q_4$), without remarkable performance variation. For example, the clock used for precharging transistors ($Q_3$, $Q_4$) may work properly if $$V_{Low} = VDD - |V_{TP}| - \delta$$

Where $\delta$ is a constant that determines the speed of precharging. Using larger $\delta$ speeds up the precharging process. The load capacitance has to be considered when calculating $\delta$ because the load nodes must be charged to VDD independently of the previous output state. This precharging can not exceed $$\frac{T}{2}$$

time where T is the clock cycle period.

This reduced swing clock is not recommended for the evaluation transistor $Q_1$ because it reduces the current driven through the MCML block. Hence, the delay will increase, as discussed above. Finally, the clock power may also be reduced dramatically by decreasing the supply voltage.

The DyCML family of circuits according to the present invention has been designed, simulated and fabricated in 0.6 µm (HP/MOSIS/CMC) CMOS technology. This technology has effective channel width of 0.6 µm and threshold voltages of about 0.7 and 0.9 volts for N and P transistors, as shown in Table 2. The designs are optimized for power-delay product reduction.

TABLE 2

Parameters o 0.5 µm CMOS Technology

| Feature | NMOS | PMOS |
|---|---|---|
| Minimum channel length | 0.6 µm | 0.6 µm |
| Minimum channel width | 1.0 µm | 1.0 µm |
| Effective channel width | $W_{drawn}$ - 0.41 µm | $W_{drawn}$ - 0.41 µm |
| $V_T$ | 0.66 V | 0.92 V |
| Oxide thickness | 96 A° | 130 A° |
| $\mu_0$ | 546 $cm^2V^{-1}sec^{-1}$ | 135 $cm^2V^{-1}sec^{-1}$ |
| Cgso | 305 p F/m | 239 p F/m |
| Cgdo | 305 p F/m | 239 p F/m |
| Cj | 562µ F/m | 935µ F/m |
| Cjsw | 50 p F/m | 289 p F/m |

Figure 8:
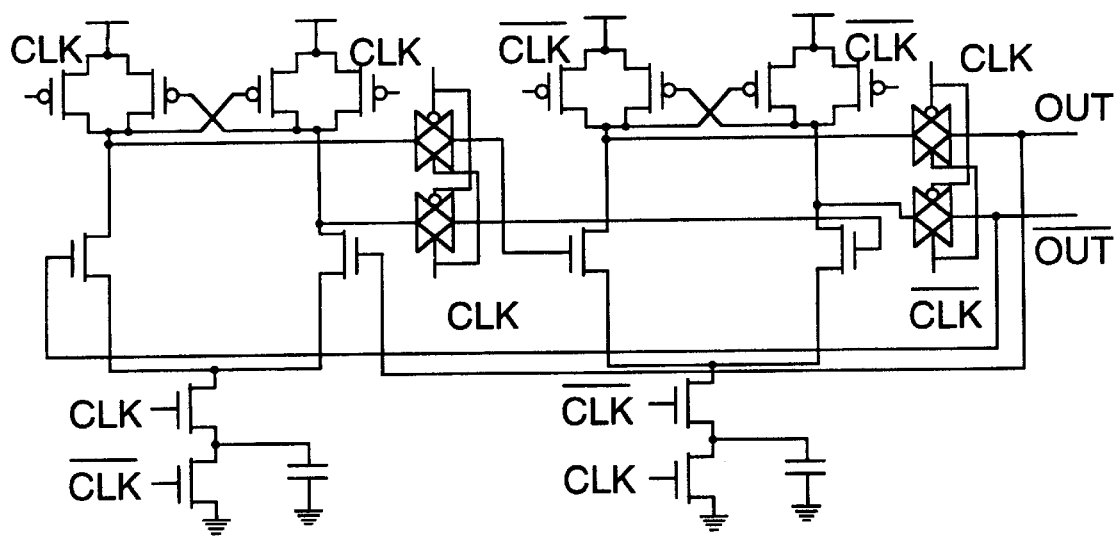
FIG. 8 is a schematic diagram of a DyCML divide by 2 circuit (toggle flip flop) using pipelined inverters of the sort depicted in FIG. 6, according to a further embodiment of the present invention.
Figure 9A:
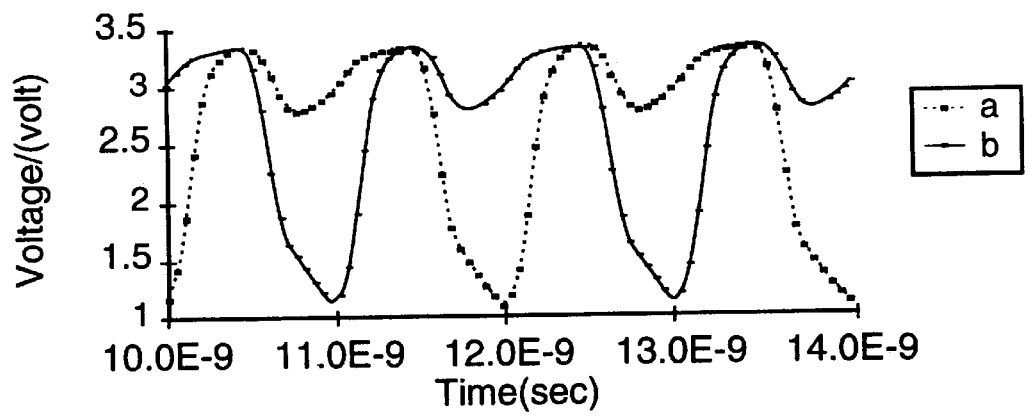
FIG. 9 shows voltages at different points in the DyCML inverter forming the circuit of FIG. 8.
Figure 9B:
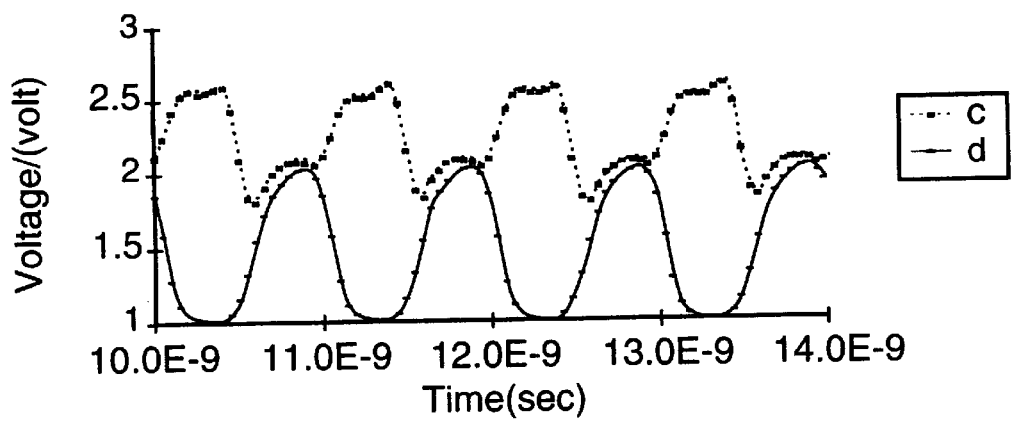
Figure 9C:
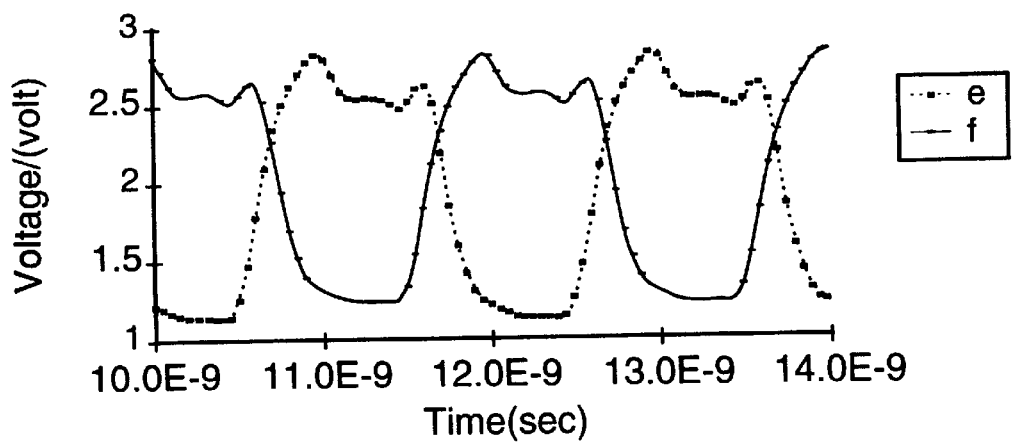

A divide-by-two circuit has been designed using the pipelined version of DyCML as shown in FIG. 8. It consists of two cascaded inverters, one of which is clocked by the CLK signal and the other being clocked by $\overline{CLK}$. The output of the second inverter is connected in a negative feedback manner to the input of the first inverter to construct a toggle flip flop. This circuit has been simulated at different operating conditions to study the performance of the DyCML configuration. The voltages at different points in the pipelined DyCML inverter are shown in FIG. 9 at an input clock frequency of 1 GHz and a supply voltage of 3.3 volts.

Figure 10:
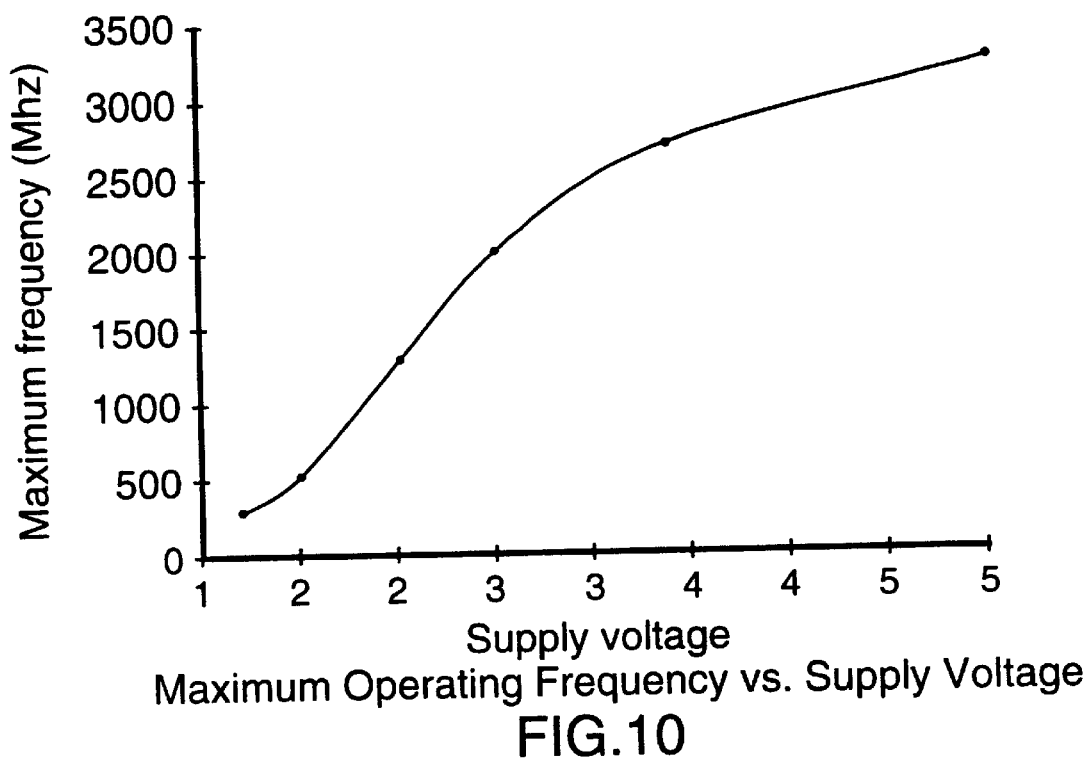
FIG. 10 shows the maximum operating frequency vs. supply voltage for the circuit of FIG. 8.

FIG. 10 shows the maximum operating frequency of the divide-by-two circuit of FIG. 8 versus the supply voltage. In this case, the maximum frequency is estimated to be the frequency at which the output voltage swing will be 20% of the supply voltage. Using the lower output swing may not result in noise immune performance. The lower limit on the logic swing must take into consideration the variation of the threshold of the NMOS transistors ($V_{TN}$) during fabrication because if the swing is lower than the variation in $V_{TN}$ incorrect results may be obtained from the MCML logic block. Simulation results show that the divide-by-two circuit can operate at 0.5 GHz frequency with 1.5V voltage supply and a voltage swing of 0.3 volts. At 3.3 volts, the divide-by-two circuit is capable of reaching operating speeds of up to 2.5 GHz.

Figure 11:
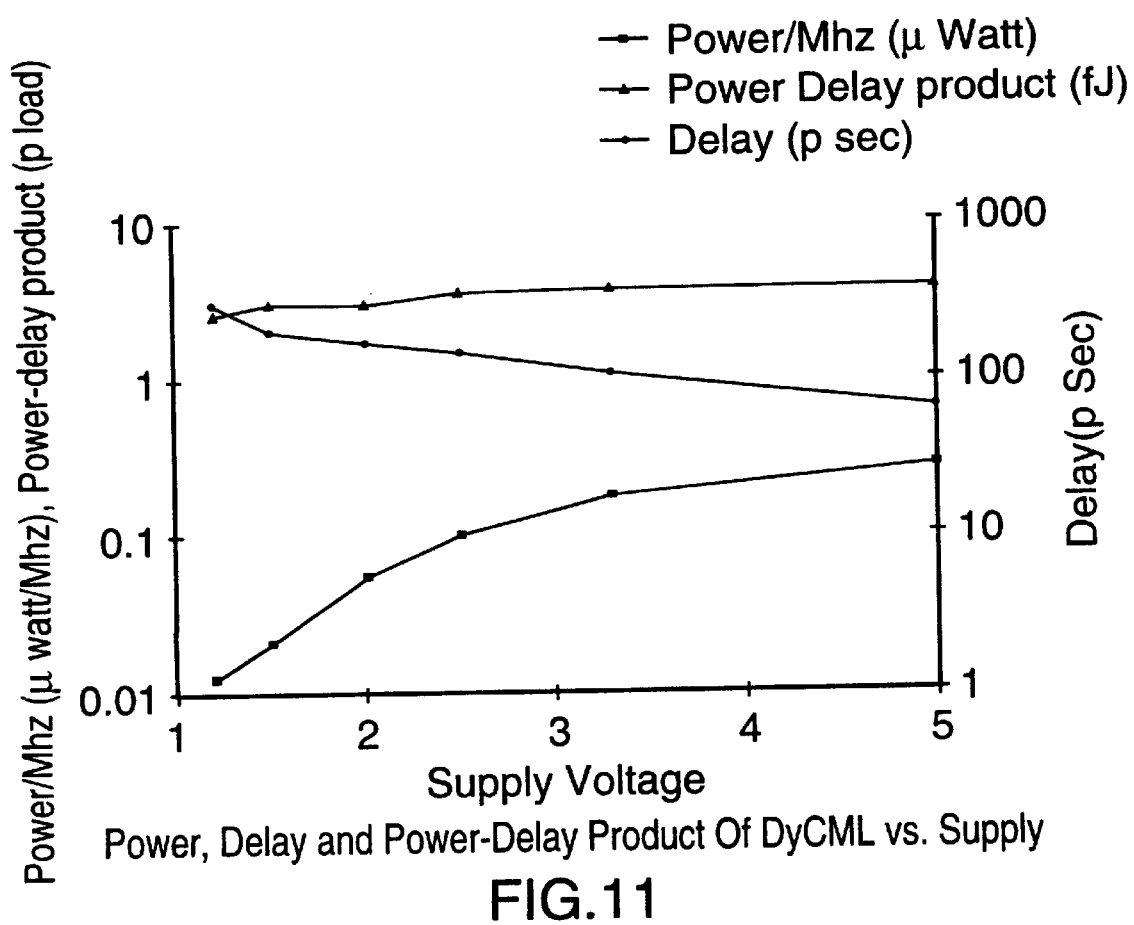
FIG. 11 shows delay, power and power-delay products vs. supply voltage for the circuit of FIG. 8.

As compared to prior art MCML circuits, the DyCML circuits of the present invention are capable of achieving 43% higher frequency for a given supply voltage and given power consumption. FIG. 11 represents power/MHz, delay and power delay product against supply voltage for the circuit of FIG. 8 at 250 MHz operating frequency, as expected, it can be seen that the power increases with the supply voltage, whereas the delay decreases with increased supply voltage. However, the power-delay product remains constant throughout the entire operating range.

Figure 12:
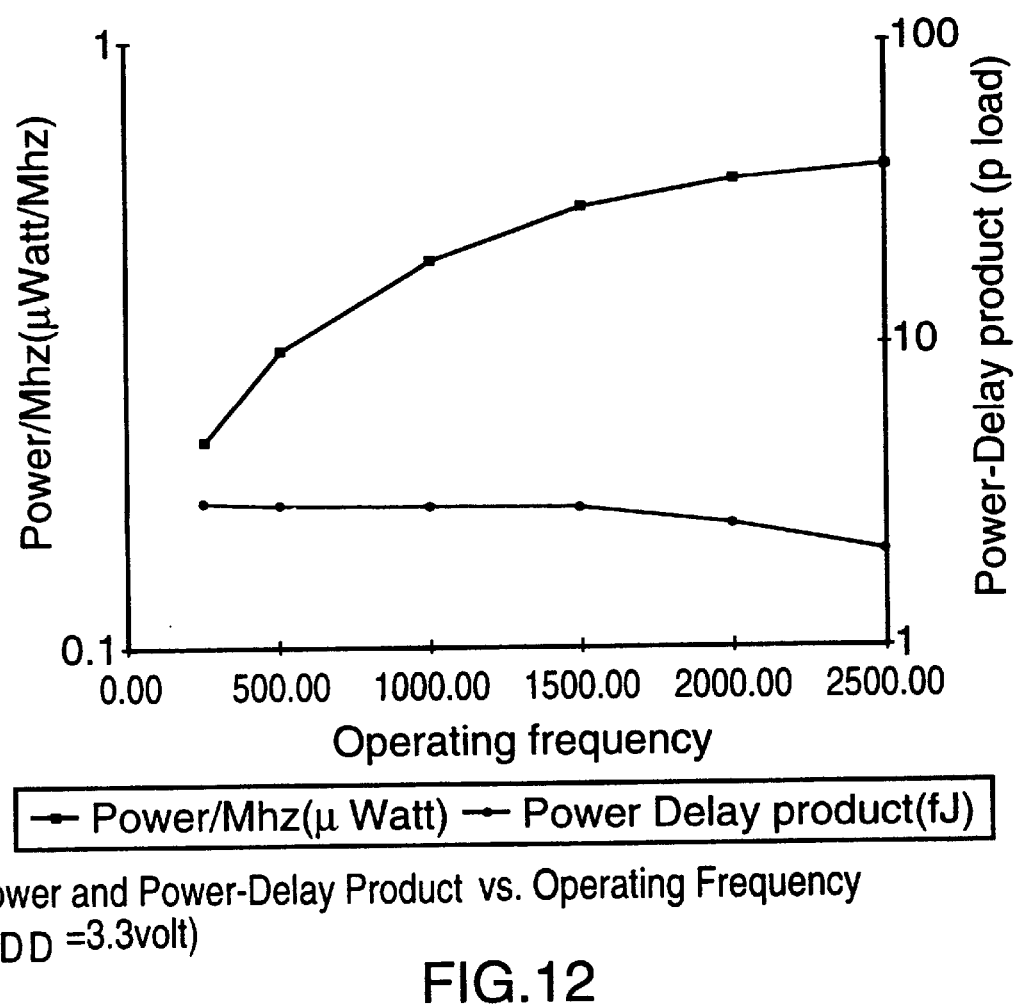
FIG. 12 shows power and power-delay product at different operating frequency (VDD=3.3V) for the circuit of FIG. 8.

FIG. 12 displays power/MHz, delay and power delay product versus operating frequency at 3.3V supply voltage. It is evident from FIG. 12 that the power/MHz ratio is almost constant. Since static power adds constant power independent of frequency it is evident that there is no static power in the DyCML circuitry according to the present invention.

Figure 13:
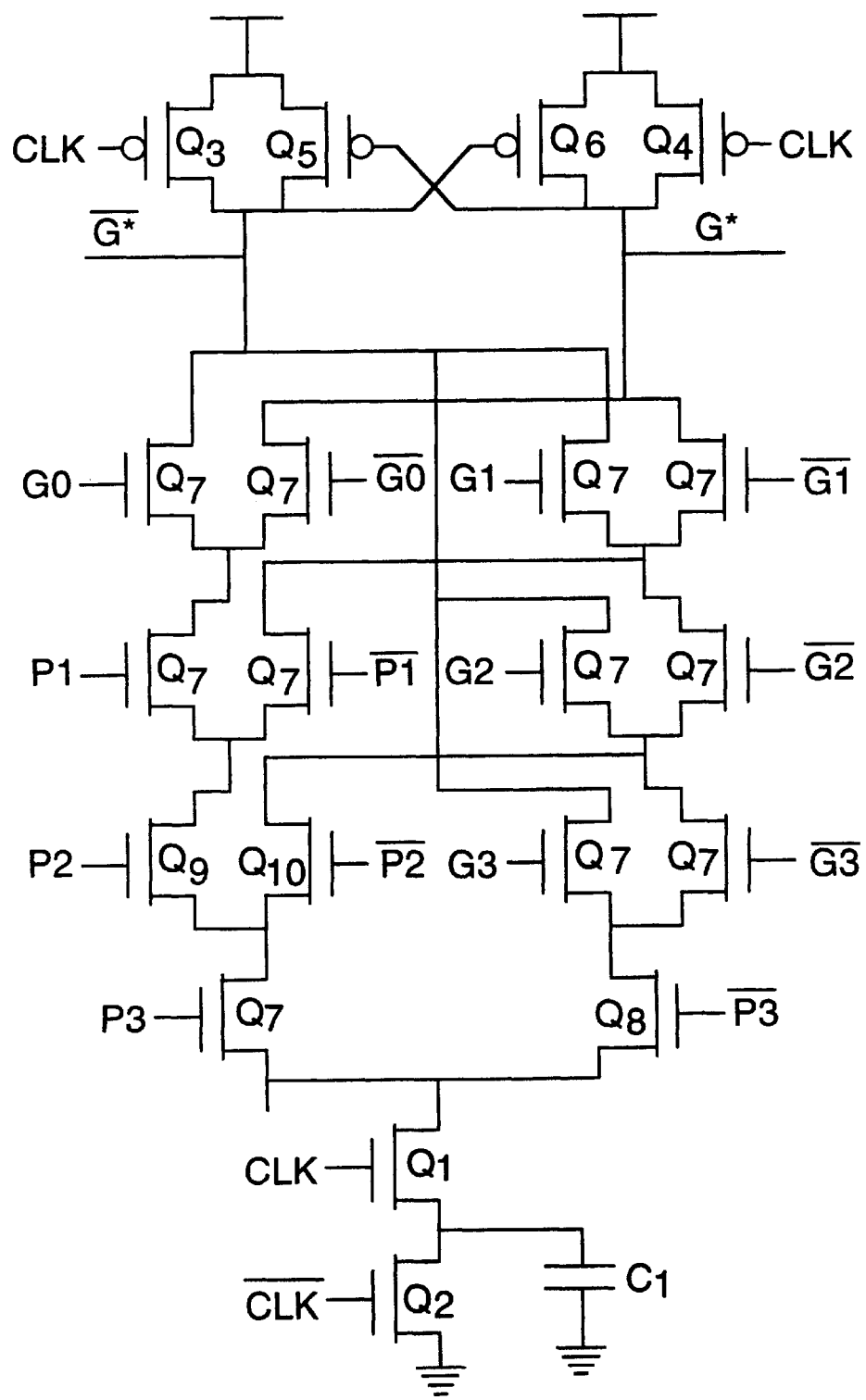
FIG. 13 is a schematic diagram of a 4 bit Carry Look Ahead (CLA) adder according to the present invention.

A 4 bit Carry Look Ahead (CLA) adder is shown in FIG. 13 which has been used as one block of a 16 bit CLA of cascaded DyCML circuits in accordance with the principles of the present invention. The logic function of the adder shown in FIG. 13 is $$G^* = G_3 + P_3G_2 + P_3P_2G_1 + P_3P_2P_1G_0$$

Figure 14:
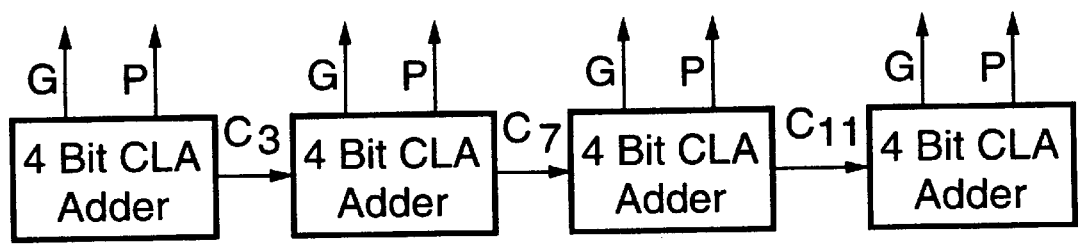
FIG. 14 is a block diagram of a 1 level, 16 bit CLA adder using four 4 bit adders as shown in FIG. 13.

The adder is constructed using four such blocks, as shown in FIG. 14. Each block provides the necessary block generate and block propagate signals that may be used for a second CLA level, rather than the single level shown in FIG. 14. Test results have indicated that, when compared to a standard CMOS implementation of the same circuit, with ideal SCMOS circuits and synchronized inputs and stable power supply, a 40% reduction in power dissipation and 50% reduction in delay were obtained with the DyCML configuration of FIGS. 13 and 14 (i.e. 30% of the power delay product of the standard prior art CMOS implementation).

To summarize, a new logic family (DyCML) is provided according to the present invention. A major advantage of the DyCML family is the provision of controllable-output swing, and hence power consumption. Also, the use of a dynamic current source provides shorter delays compared with prior art MCML circuits. Other advantages inherited from MCML are high-performance, low supply voltage, low noise and low jitter. The DyCML family of circuits is easy to pipeline or cascade in both synchronous and asynchronous modes. It is also suitable for portable computers and wireless communication systems and for critical paths in complex microprocessor systems and multimedia applications where low power is required with high throughput. The DyCML circuitry according to the present invention is also suitable for fabrication using Multiple Threshold CMOS technology (MTCMOS), wherein the precharge transistors are implemented using high $V_T$ while the remainder of the circuitry is implemented using low $V_T$ transistors for increased speed.

Other embodiments, modifications and applications of the invention are possible. All such variations and applications are believed to be within the sphere and scope of the invention as defined by the claims appended hereto.

We claim:

1. A dynamic current mode logic circuit, comprising:
   a MOS current mode logic block having complementary inputs and outputs, a power supply input and ground input;
   a precharge circuit connected to a power supply source and to said power supply input of said MOS current mode logic block for precharging said complementary outputs during a precharge phase of operation of said MOS current mode logic block;
   an evaluation circuit connected to said ground input of said MOS current mode logic block for gating current therethrough during an evaluation phase of operation of said MOS current mode logic block; and
   a dynamic current source connected to said evaluation circuit for driving a large current through said MOS current mode logic block during said evaluation phase.

2. The dynamic current mode logic circuit defined by claim 1, further including an accelerating latch connected to said precharge circuit and said MOS current mode logic block for charging one of said complementary outputs when the voltage on the other one of said outputs drops below a predetermined threshold during said evaluation phase.

3. The dynamic current mode logic circuit defined by claim 2, wherein said precharge circuit comprises a pair of transistors of a first polarity type, each of said transistors having a first terminal connected to said power supply source, a second terminal connected to a respective one of said complementary outputs, and a control terminal connected to a source of clock signal for defining said precharge and said evaluation phases of operation of said MOS current mode logic block, and a further transistor of an opposite polarity type having a first terminal connected to said evaluation circuit and said dynamic current source, a second terminal connected to ground and a control terminal connected to a complement of said source of clock signal.

4. The dynamic current mode logic circuit defined by claim 3, wherein said evaluation circuit comprises an additional transistor of said opposite polarity type having a first terminal connected to said ground input of said MOS current mode logic block, a second terminal connected to said first terminal of said further transistor and a control terminal connected to said source of clock signal.

5. The dynamic current mode logic circuit defined by claim 4, wherein said dynamic current source comprises a capacitor connected to said first terminal of said additional transistor and said second terminal of said further transistor.

6. The dynamic current mode logic circuit defined by claim 3, wherein said accelerating latch comprises a further pair of transistors of said first polarity type, each one of said further transistors having a first terminal connected to said power supply source, a second terminal connected to a respective one of said complementary outputs, and a control terminal connected to an opposite respective one of said complementary outputs.

7. The dynamic current mode logic circuit defined by claim 3, wherein said clock signal source comprises a differential clock generator with single ended termination.

8. The dynamic current mode logic circuit defined by claim 3, wherein said clock signal source generates a reduced swing clock signal for application to said precharge circuit.

9. A plurality of circuits in accordance with any one of claims 1 to 8, connected in a pipelined configuration via respective transmission gates.

* * * * *